(12) United States Patent
Liu et al.

(10) Patent No.: US 10,522,520 B2
(45) Date of Patent: Dec. 31, 2019

(54) MICRO-LED DISPLAY PANEL

(71) Applicant: PixeLED Display CO., LTD., Hsinchu County (TW)

(72) Inventors: Ying-Tsang Liu, Hsinchu County (TW); Yu-Chu Li, Hsinchu County (TW); Pei-Hsin Chen, Hsinchu County (TW); Yi-Ching Chen, Hsinchu County (TW); Tzu-Yang Lin, Hsinchu County (TW); Yu-Hung Lai, Hsinchu County (TW)

(73) Assignee: PixeLED Display CO., LTD., Hsinchu County (TW)

( * ) Notice: Subject to any disclaimer, the term of this patent is extended or adjusted under 35 U.S.C. 154(b) by 0 days.

(21) Appl. No.: 16/154,740

(22) Filed: Oct. 9, 2018

(65) Prior Publication Data

US 2019/0131281 A1    May 2, 2019

(30) Foreign Application Priority Data

Nov. 2, 2017    (TW) .............................. 106137872 A

(51) Int. Cl.
*H01L 25/075*    (2006.01)
*H01L 33/38*    (2010.01)
*H01L 33/48*    (2010.01)

(52) U.S. Cl.
CPC .......... *H01L 25/0753* (2013.01); *H01L 33/38* (2013.01); *H01L 33/483* (2013.01)

(58) Field of Classification Search
CPC ..... H01L 25/0753; H01L 33/38; H01L 33/44; H01L 33/483
See application file for complete search history.

(56) References Cited

U.S. PATENT DOCUMENTS

| | | | | |
|---|---|---|---|---|
| 2013/0313590 A1* | 11/2013 | Akimoto | ................. | H01L 33/62 257/98 |
| 2015/0255440 A1* | 9/2015 | Hsieh | ................. | H01L 25/0753 257/88 |
| 2015/0295142 A1* | 10/2015 | Huang | ................. | H01L 33/486 257/99 |
| 2015/0318444 A1* | 11/2015 | Huang | ................ | H01L 25/0753 257/99 |
| 2016/0079483 A1* | 3/2016 | Obata | ................... | H01L 33/486 257/91 |
| 2019/0131282 A1* | 5/2019 | Liu | ..................... | H01L 25/0753 |

* cited by examiner

*Primary Examiner* — Allan R Wilson
(74) *Attorney, Agent, or Firm* — JCIPRNET

(57) ABSTRACT

A micro-LED display panel including a substrate, a plurality of micro-LEDs, and a plurality of reinforced structures is provided. The micro-LEDs are disposed at a side of the substrate, wherein each of the micro-LEDs comprises an epitaxial layer and an electrode layer electrically connected to the epitaxial layer, and the electrode layer are located between the epitaxial layers and the substrate. Each of the micro-LEDs is electrically connected to the substrate through the corresponding electrode layer. Each of electrode layers includes a first electrode and a second electrode. The reinforced structures are disposed between the micro-LEDs and the substrate respectively, and each of the reinforced structures is located between the corresponding the first electrode and the second electrode. A Young's modulus of each of reinforced structures is smaller than a Young's modulus of the corresponding electrode layer.

12 Claims, 3 Drawing Sheets

MICRO-LED DISPLAY PANEL

CROSS-REFERENCE TO RELATED APPLICATION

This application claims the priority benefit of Taiwan application serial no. 106137872, filed on Nov. 2, 2017. The entirety of the above-mentioned patent application is hereby incorporated by reference herein and made a part of this specification.

BACKGROUND OF THE INVENTION

Field of the Invention

The invention relates to a display panel, and more particularly to a micro-LED (light emitting diode) display panel.

Description of Related Art

Micro-LED displays have advantages not only in low power consumption, high brightness, high color saturation, and fast response, but also in material stability and image sticking. Therefore, the development of the display technology of micro-LED displays has drawn much attention.

In terms of the manufacturing process, in the process of transferring micro-LEDs from a growth substrate to a driving circuit substrate, it is required to apply heat and pressure to the micro-LEDs, so as to electrically bond the micro-LEDs to the driving circuit substrate. However, in the transfer process, the micro-LEDs may be damaged easily or even break, which impairs the reliability of the micro-LED display.

SUMMARY OF THE INVENTION

The present invention provides a micro-LED display panel having excellent reliability.

A micro-LED display panel according to an embodiment of the invention includes a substrate, a plurality of micro-LEDs and a plurality of reinforcing structures. The micro-LEDs are disposed at a side of the substrate, wherein each of the micro-LEDs comprises an epitaxial layer and an electrode layer disposed on and electrically connected to the epitaxial layer, and the electrode layers are located between the substrate and the epitaxial layers. Each of the micro-LEDs is electrically connected with the substrate through the corresponding electrode layer, wherein a ratio of a thickness of the electrode layer of each of the micro-LEDs to a thickness of the epitaxial layer of the each of the micro-LEDs is in a range of 0.3 to 0.5, and each of the electrode layers comprises a first electrode and a second electrode disposed separately. The reinforcing structures are respectively disposed between the micro-LEDs and the substrate, and each reinforcing structure is located between the corresponding first electrode and the corresponding second electrode, wherein a Young's modulus of each reinforcing structure is smaller than a Young's modulus of the corresponding electrode layer.

In an embodiment of the invention, each of the epitaxial layers includes a first type semiconductor layer, a light emitting layer and a second type semiconductor layer. The light emitting layer is located between the first type semiconductor layer and the second type semiconductor layer of each of the epitaxial layers, wherein each of the first electrodes is electrically contacted with the corresponding first type semiconductor layer, and each of the second electrodes is electrically contacted with the corresponding second type semiconductor layer through a conductive hole penetrating the corresponding first type semiconductor layer and the corresponding light emitting layer.

In an embodiment of the invention, a ratio of a depth of each of the conductive holes to a thickness of the corresponding epitaxial layer is in a range of 0.15 to 0.35.

In an embodiment of the invention, a length of each of the micro-LEDs is in a range of 3 nm to 100 nm, and a gap between the first electrode and the second electrode of each of the micro-LEDs is in a range of 1 nm to 30 nm.

In an embodiment of the invention, a ratio of a gap between each of the first electrodes and the corresponding second electrode to a length of the corresponding micro-LED is in a range of 0.1 to 0.25.

In an embodiment of the invention, each of the micro-LEDs has a first side surface of the first electrode and a second side surface of the second electrode, the first side surface faces toward the second side surface of each of the micro-LEDs, and each of the reinforcing structures is contacted with the corresponding first side surface and the corresponding second side surface.

In an embodiment of the invention, the substrate includes a plurality of supporting structures, a plurality of first pads and a plurality of second pads, each of the first electrodes is electrically contacted with the corresponding first pad, each of the second electrodes is electrically contacted with the corresponding second pad, and each of the supporting structures is disposed between the corresponding first electrodes and the corresponding second electrodes and contacted with the corresponding reinforcing structure.

In an embodiment of the invention, the first electrode of each of the micro-LEDs has a first bonding surface facing toward the substrate, each of the reinforcing structures has a top surface facing toward the substrate, and a step height between each of the first bonding surfaces and the corresponding top surface is smaller than or equal to 50% of a thickness of the corresponding first electrode.

In an embodiment of the invention, the second electrode of each of the micro-LEDs has a second bonding surface facing toward the substrate, and the top surface of each of the reinforcing structures excesses the corresponding first bonding surface and second bonding surface.

In an embodiment of the invention, the substrate includes a plurality of first pads and a plurality of second pads, each of the first electrodes is electrically contacted with the corresponding first pad, each of the second electrodes is electrically contacted with the corresponding second pad, and each of the reinforcing structures inserts between the corresponding first pad and second pad.

In an embodiment of the invention, at least one of the reinforcing structures has a first height, and at least another one of the reinforcing structures has a second height, wherein the first height is greater than the second height.

In an embodiment of the invention, the micro-LED display panel further includes a plurality of bonding layers, and the micro-LEDs are electrically connected with the substrate through the bonding layers. At least one of the bonding layers has a first thickness, and at least another one of the bonding layers has a second thickness, wherein the first thickness is greater than the second thickness.

Base on the above, the micro-LEDs of the micro-LED display panel of the invention are configured with a plurality of reinforcing structures respectively. During the process of transferring the micro-LEDs to the substrate, the reinforcing structures can serve as buffers when the micro-LEDs being heated and pressurized to prevent the micro-LEDs from being damaged or cracked. Thereby, reliability of the micro-LED display panel can be enhanced.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figures 1, 2:
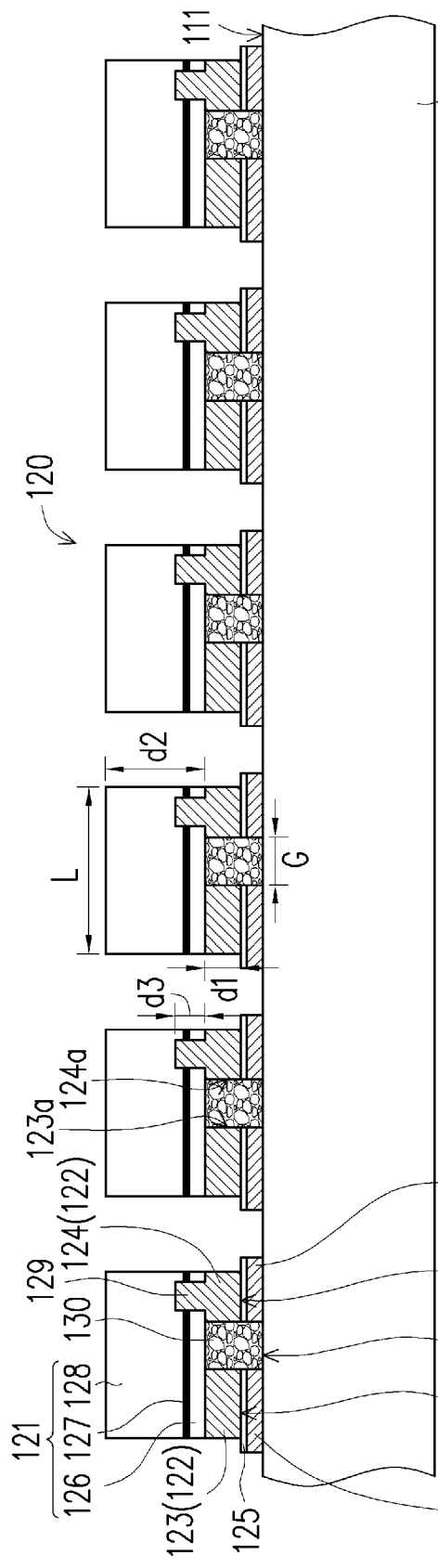
FIG. 1 is a schematic partial cross-sectional view of a micro-LED display panel according to a first embodiment of the invention.
FIG. 2 is a schematic partial cross-sectional view of a micro-LED display panel according to a second embodiment of the invention.

Some other embodiments of the invention are provided as follows. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

FIG. 1 is a schematic partial cross-sectional view of a micro-LED display panel according to a first embodiment of the invention. Referring to FIG. 1, in this embodiment, a micro-LED display panel 100 includes a substrate 110, a plurality of micro-LEDs 120 and a plurality of reinforcing structures 130, wherein the substrate 110 may be a drive circuit substrate having a drive circuit (not illustrated), a plurality pairs of pads 112 are disposed on a surface 111 of the substrate 110 and electrically connected to a drive circuit (not illustrated), and each pair of pads 112 includes a first pad 113 and a second pad 114.

The micro-LEDs 120 are disposed on the surface 111 of the substrate 110. Each micro-LED 120 includes an epitaxial layer 121 and an electrode layer 122 electrically connected to the epitaxial layer 121, and the electrode layer 122 is located between the substrate 110 and the epitaxial layer 121. Each micro-LED 120 is electrically connected to the substrate 110 through the corresponding electrode layer 122, wherein a ratio of a thickness d1 of the electrode layer 122 to a thickness d2 of the corresponding epitaxial layer 121 is in a range of 0.3 to 0.5 in one of the micro-LEDs 120. If the thickness d1 of each electrode layer 122 is too thin, poor conduction or uneven current distribution occurs.

Each electrode layer 122 includes a first electrode 123 and a second electrode 124, and the first electrode 123 and the second electrode 124 are disposed separately on the epitaxial layer 121, wherein the first electrode 123 is electrically connected to the first pad 113, and the second electrode 124 is electrically connected to the second pad 114. During a process of transferring the micro-LEDs 120 to the substrate 110 and subjecting the micro-LEDs 120 to be electrically bonded with the substrate 110, a solder is required to be disposed on one of the pair of pads 112 or on the electrode layer 122, wherein a material of the solder may be indium, tin, gold, other electrically conducting metal or electrically conducting alloy. Next, the first electrode 123 is subjected to be aligned with the first pad 113, and the second electrode 124 is subjected to be aligned with the second pad 114. Next, the first electrode 123 is subjected to be contacted with the first pad 113 through the solder, and the second electrode 124 is subjected to be contacted with the second pad 114 through the solder. A process of pressurizing and heating is performed, and the reflowed solder may form a bonding layer 125 so that the micro-LEDs 120 are electrically bonded with the substrate 110. Moreover, each first electrode 123 is electrically contacted with the corresponding first pad 113 through corresponding bonding layer 125, and each second electrode 124 is electrically contacted with the corresponding second pad 114 through corresponding bonding layer 125.

Each epitaxial layer 121 includes a first type semiconductor layer 126, a light emitting layer 127 and a second type semiconductor layer 128, wherein the light emitting layer 127 is located between the first type semiconductor layer 126 and the second type semiconductor layer 128, and the light emitting layer 127 is connected with the first type semiconductor layer 126 and the second type semiconductor layer 128. Moreover, each first electrode 123 is electrically contacted with the corresponding first type semiconductor layer 126, and each second electrode 124 is electrically contacted with the corresponding second type semiconductor layer 128 through a conductive hole 129 penetrating the corresponding first type semiconductor layer 126 and the corresponding light emitting layer 127.

In this embodiment, a ratio of a depth d3 of the conductive hole 129 to the thickness d2 of the epitaxial layer 121 is in a range of 0.15 to 0.35 for one of the micro-LEDs, wherein the depth d3 is measured from a surface of the first type semiconductor layer 126 thereon to an end of each conductive hole 129. If the depth d3 of each conductive hole 129 is too deep, the epitaxial layer 121 breaks easily when pressure is applied.

In this embodiment, a length L of each micro-LED 120 is in a range of 3 nm to 100 nm, and a gap G between the first electrode 123 and the second electrode 124 of each micro-LED 120 is in a range of 1 nm to 30 nm. Moreover, a ratio of the gap G between the first electrode 123 and the second electrode 124 of each micro-LED 120 to the length L of the corresponding micro-LED 120 is in a range of 0.1 to 0.25. If the gap G between the first electrode 123 and the second electrode 124 of each micro-LED 120 is too narrow, the first electrode 123 and the second electrode 124 of each micro-LED 120 may be bridged by the bonding layer 125 and results in short circuit. If the gap G between the first electrode 123 and the second electrode 124 of each micro-LED 120 is too wide, an area of the first electrode 123 and an area of the second electrode 124 of each micro-LED 120 decrease accordingly. As a result, the first electrode 123 and the second electrode 124 of each micro-LED 120 may be hard to align with the corresponding pair of pads 112 accurately and results in low bonding yield rate.

Referring to FIG. 1, the reinforcing structures 130 are respectively disposed between the micro-LEDs 120 and the substrate 110. Moreover, a reinforcing structure 130 is disposed between a first electrode 123 and a second electrode 124 of each micro-LED 120, and the reinforcing structure 130, the first electrode 123 and the second electrode 124 are all disposed on the same side of the epitaxial layer 121. A material of the reinforcing structures 130 may be an organic material (such as a photoresist material, a resin material or a macromolecular material), an inorganic material (such as silicon oxide or nitride) or a hybrid organic-inorganic material, and a Young's modulus of each reinforcing structure 130 is smaller than a Young's modulus of the corresponding electrode layer 122. In other words, when applied by a force, the reinforcing structure 130 has an elastic deformation greater than an elastic deformation of the electrode layer 122. Therefore, during the process of transferring the micro-LEDs 120 to the substrate 110, the reinforcing structures 130 can serve as buffers when the epitaxial layers 121 being heated and pressurized to prevent the epitaxial layers 121 from being damaged or cracked. In this embodiment, a material of the reinforcing structures 130 is an organic material, such as benzocyclobutene (BCB) or polyimide (PI), and a Young's modulus of the reinforcing structures is in a range of 2.5 GPa to 5 GPa preferably within a range from 2.9 GPa to 3.6 GPa.

In this embodiment, each first electrode 123 has a first side surface 123a and each second electrode 124 has a second side surface 124a. For one of the micro-LEDs 120, the first side surface 123a faces toward the second side surface 124a of the one of the micro-LEDs, and the reinforcing structure 130 is contacted with the first side surface 123a and the second side surface 124a. Each first electrode 123 has a first bonding surface 123b facing toward the substrate 110 and each second electrode 124 has a second bonding surface 124b facing toward the substrate 110, wherein the first bonding surface 123b and the second bonding surface 124b are respectively contacted with the corresponding bonding layer 125.

Each reinforcing structure 130 has a top surface 131 facing toward the substrate 110, and a step height between the first bonding surface 123b of each first electrode 123 and the corresponding reinforcing structure 130 is smaller than or equal to half a thickness of the corresponding first electrode 123 (i.e., 50% of the thickness d1 of the electrode layer 122). In this embodiment, the top surface 131 of each reinforcing structure 130 excesses the corresponding first bonding surface 123b and the corresponding second bonding surface 124b (i.e., a distance between the top surface 131 and the first type semiconductor layer 126 is greater than a distance between the first bonding surface 123b and the first type semiconductor layer 126), wherein one of the reinforcing structures 130 disposed on one of the micro-LEDs 120 and located between the first pad 113 and the second pad 114 of the one of the micro-LEDs 120, and the top surface 131 of the one of the reinforcing structure 130 may contact with the surface 111 of the substrate 110 for providing buffering and supporting effects. Alignment between the micro-LEDs 120 and the pairs of pads 112 will be improved with the reinforcing structure 130, in other words, during the process of transferring each micro-LED 120 to the substrate 110, subjecting the first electrode 123 and the second electrode 124 of each micro-LED 120 to be respectively aligned with corresponding first pad 113 and second pad 114 and thereby enhancing the bonding yield rate.

Some other embodiments of the invention are provided as follows. It should be noted that the reference numerals and part of the contents of the previous embodiment are used in the following embodiments, in which identical reference numerals indicate identical or similar components, and descriptions of the same technical contents are omitted. Please refer to the description of the previous embodiment for the omitted contents, which will not be repeated hereinafter.

FIG. 2 is a schematic partial cross-sectional view of a micro-LED display panel according to a second embodiment of the invention. Referring to FIG. 2, the difference between a micro-LED display panel 100A of this embodiment and the micro-LED display panel 100 of the first embodiment is: a substrate 110a of this embodiment further includes a plurality of supporting structures 115a, and at least one supporting structure 115a is disposed between the first pad 113 and the second pad 114 disposed in pair. The supporting structures 115a are preferably formed by an insulating material, but is not limited thereto. For example, a number of the supporting structures 115a substantially is equal to a number of a plurality of reinforcing structures 130a, wherein a top surface 131a of each reinforcing structures 130a is coplanar with the corresponding first bonding surface 123b and the corresponding second bonding surface 124b (in other words, a distance between the top surface 131a and the first type semiconductor layer 126 is equal to a distance between the first bonding surface 123b and the first type semiconductor layer 126), and each supporting structure 115a excesses a surface of the corresponding first pad 113 and second pad 114 where the bonding layer 125 is located. During the process of transferring each micro-LED 120 to the substrate 110, each supporting structure 115a can serve as a buffer and a supporter for being contacted with the top surface 131a of the corresponding reinforcing structure 130a when each micro-LED 120 being heated and pressurized. In this embodiment, a cross-sectional shape of the supporting structures 115a may be a trapezoid, but is not limited thereto.

Figure 3:
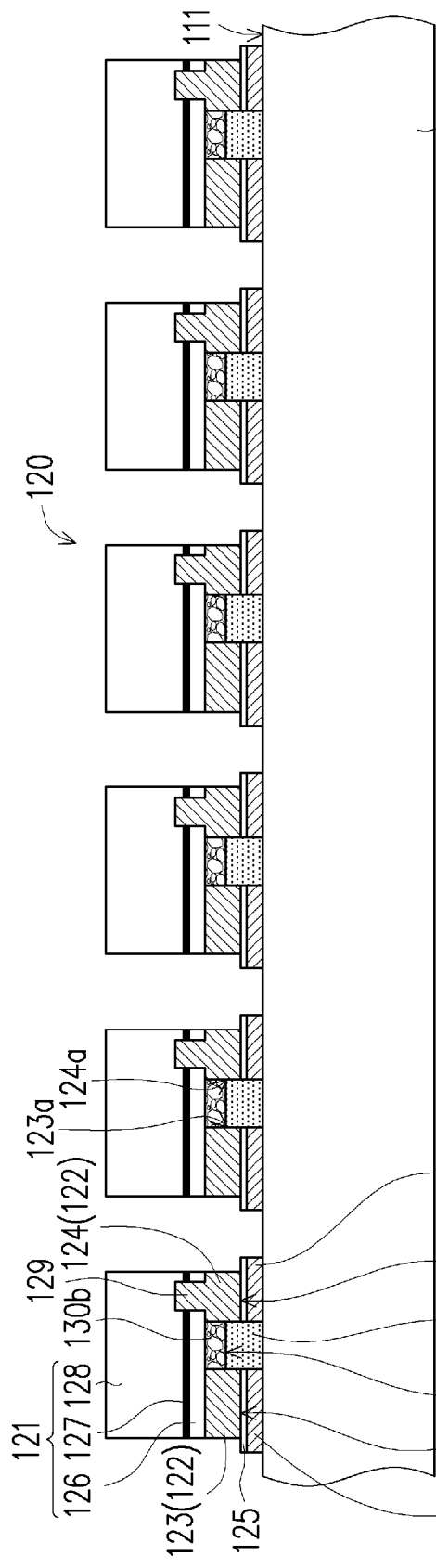
FIG. 3 is a schematic partial cross-sectional view of a micro-LED display panel according to a third embodiment of the invention.

FIG. 3 is a schematic partial cross-sectional view of a micro-LED display panel according to a third embodiment of the invention. Referring to FIG. 3, the difference between a micro-LED display panel 100B of this embodiment and the micro-LED display panel 100 of the first embodiment is: a substrate 110b of this embodiment further includes a plurality of supporting structures 115b formed on the surface 111, and one supporting structure 115b is disposed between the first pad 113 and the second pad 114 disposed in pair. A number of the supporting structures 115b substantially is equal to a number of the reinforcing structures 130b, wherein a top surface 131b of each reinforcing structure 130b is lower to the corresponding first bonding surface 123b and second bonding surface 124b (i.e., a distance between the top surface 131b and the first type semiconductor layer 126 is smaller than a distance between the first bonding surface 123b and the first type semiconductor layer 126 and a distance between the second bonding surface 124b and the first type semiconductor layer 126), and each supporting structure 115b excesses the bonding layer 125 on the corresponding first pad 113 and second pad 114. During the process of transferring each micro-LED 120 to the substrate 110, each supporting structure 115b can serve as a buffer, a supporter and an alignment auxiliary for being inserted between the corresponding first electrode 123 and the corresponding second electrode 124 and contacted with the top surface 131b of the corresponding reinforcing structure 130b when each micro-LED 120 being heated and pressurized. For example, a cross-sectional shape of the supporting structures 115b may be a rectangle, and the supporting structures 115b may be formed integrally on the surface 111

(that is, the supporting structures 115b and the substrate 110b may be formed by the same material), but the invention is not limited thereto.

Figure 4:
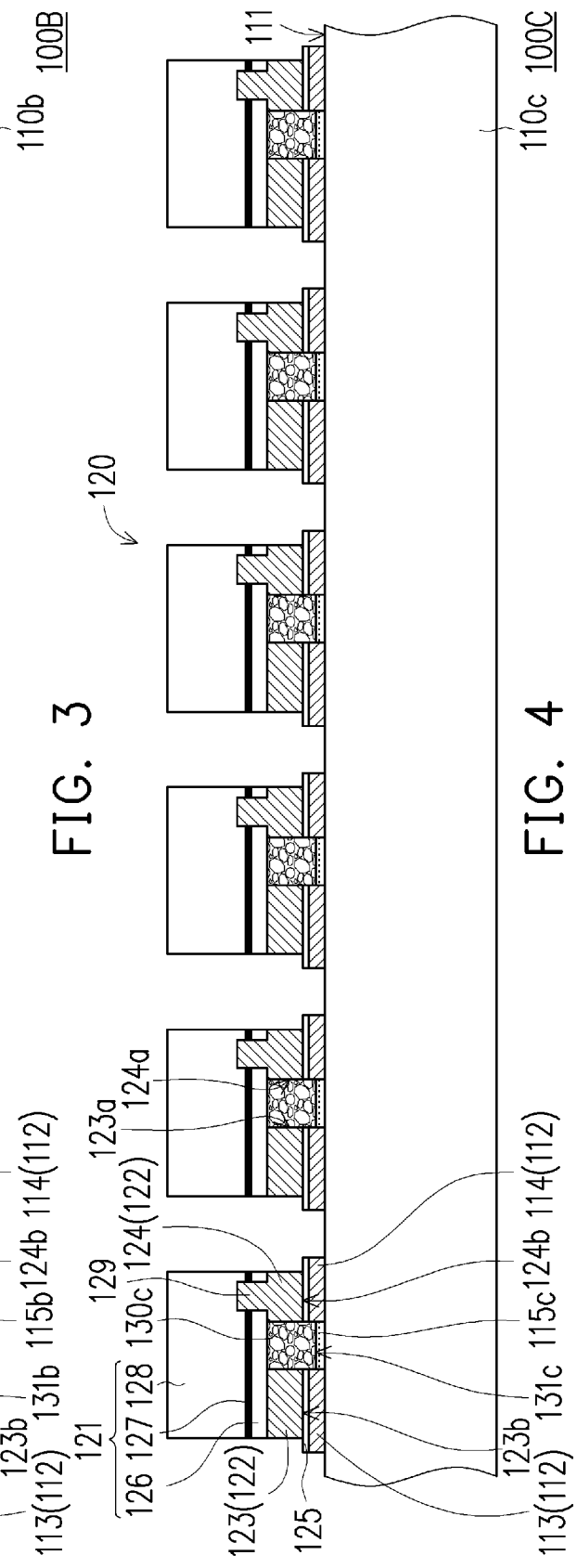
FIG. 4 is a schematic partial cross-sectional view of a micro-LED display panel according to a fourth embodiment of the invention.

FIG. 4 is a schematic partial cross-sectional view of a micro-LED display panel according to a fourth embodiment of the invention. Referring to FIG. 4, the difference between a micro-LED display panel 100C of this embodiment and the micro-LED display panel 100 of the first embodiment is: a substrate 110c of this embodiment further includes a plurality of supporting structures 115c formed on the surface 111, and one supporting structure 115c is disposed between the first pad 113 and the second pad 114 disposed in pair. A number of the supporting structures 115c substantially is equal to a number of the reinforcing structures 130c, wherein a top surface 131c of each reinforcing structure 130c excesses the corresponding first bonding surface 123b and the corresponding second bonding surface 124b (i.e., a distance between the top surface 131c and the first type semiconductor layer 126 is greater than a distance between the first bonding surface 123b and the first type semiconductor layer 126 or a distance between the second bonding surface 124b and the first type semiconductor layer 126), and each supporting structure 115b is lower to a surface of the corresponding first pad 113 and second pad 114 where the bonding layer 125 is located. During the process of transferring each micro-LED 120 to the substrate 110, each reinforcing structure 130c can serve as a buffer, a supporter and an alignment auxiliary for being inserted between the corresponding first pad 113 and the corresponding second pad 114 and abutted against the corresponding supporting structure 115c through the top surface 131c thereof when each micro-LED 120 being heated and pressurized. For example, a cross-sectional shape of the supporting structures 115c may be a rectangle, and the supporting structures 115c may be formed integrally on the surface 111 (that is, the supporting structures 115c and the substrate 110c may be formed by the same material), but the invention is not limited thereto.

Figure 5:
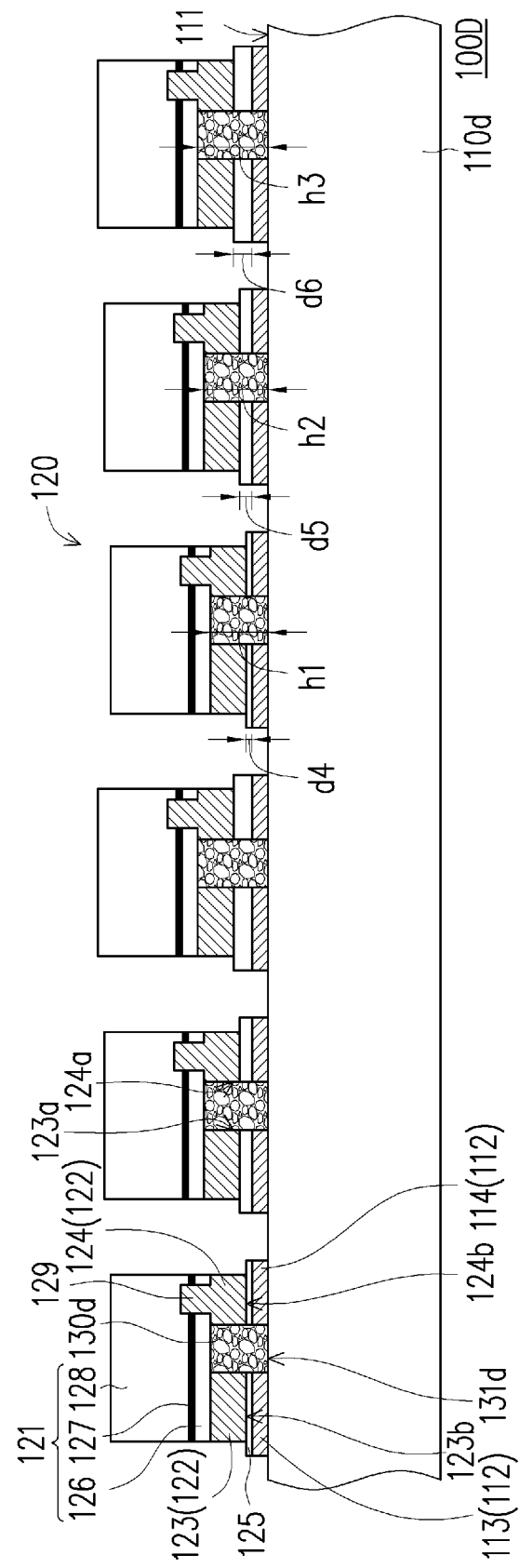
FIG. 5 is a schematic partial cross-sectional view of a micro-LED display panel according to a fifth embodiment of the invention.

FIG. 5 is a schematic partial cross-sectional view of a micro-LED display panel according to a fifth embodiment of the invention. The difference between a micro-LED display panel 100D of this embodiment and the micro-LED display panel 100 of the first embodiment is: in this embodiment, the micro-LED display panel 100D includes a plurality of reinforcing structures 130d having different heights. Furthermore, the micro-LEDs 120 in one of pixels (not drawn) may include a red micro-LED, a green micro-LED and a blue micro-LED, wherein an order of transferring the micro-LEDs 120 to a substrate 110d may be the red micro-LED, the blue micro-LED and then the green micro-LED, but is not limited thereto.

In a pixel of this embodiment, the red micro-LED is the first one micro-LED 120 that is transferred to the substrate 110d and matches with a reinforcing structure 130d having a height h1, the blue micro-LED is transferred to the substrate 110d subsequently and matches with a reinforcing structure 130d having a height h2, and the green micro-LED is the last one micro-LED 120 that is transferred to the substrate 110d and matches with a reinforcing structure 130d having a height h3, wherein the height h3 is greater than the height h2, and the height h2 is greater than the height h1. In other words, the height of one of the reinforcing structure 130d relatives to transferring order of the micro-LEDs 120 with different color. As a result, the micro-LED 120 first transferred to the substrate 110d may be protected from damages caused by pressurizing in the subsequent transfer process, and the process yield may enhance thereby.

Because a top surface 131d of each reinforcing structure 130d may contact with the surface 111 of the substrate 110 when transferring and bonding process carrying out, the reinforcing structures 130d provide buffering and supporting effects. The reinforcing structures 130d have different heights, so a distance from the first bonding surface 123b of the first electrode 123 (and the second bonding surface 124b of the second electrode 124) of the micro-LEDs 120 to the surface 111 of the substrate 110 is different between two micro-LEDs 120 with different colors. Furthermore, a distance from the first bonding surface 123b of the first electrode 123 (and the second bonding surface 124b of the second electrode 124) of one of the micro-LEDs 120, which matches the reinforcing structure 130d having a height h1, to the surface 111 of the substrate 110 is smaller than a distance from the first bonding surface 123b of the first electrode 123 (and the second bonding surface 124b of the second electrode 124) of another one micro-LED 120, which matches the reinforcing structure 130d having a height h2, to the surface 111 of the substrate 110. The distance from the first bonding surface 123b of the first electrode 123 (and the second bonding surface 124b of the second electrode 124) of the micro-LEDs 120, which matches the reinforcing structure 130d having a height h2, to the surface 111 of the substrate 110 is smaller than a distance from the first bonding surface 123b of the first electrode 123 (and the second bonding surface 124b of the second electrode 124) of the other one of the micro-LEDs 120, which matches the reinforcing structure 130d having a height h3, to the surface 111 of the substrate 110.

As described above, the pairs of pads 112 all having the same thickness and the bonding layers 125 have different height. For example, one of the bonding layers 125 having a thickness d4 is corresponding to the micro-LED 120 matching the reinforcing structure 130d having the height h1, another bonding layer 125 having a thickness d5 is corresponding to the micro-LED 120 matching the reinforcing structure 130d having the height h2, and the other one of the bonding layers 125 having a thickness d5 is corresponding to the micro-LED 120 matching the reinforcing structure 130d having the height h3. In other words, if the micro-LED 120 matches the reinforcing structure 130d having a greater height, the bonding layer 125 disposed correspondingly to the micro-LED 120 has a greater thickness.

In other embodiments, the surfaces of the micro-LEDs 120 opposite to the substrate may be coplanar with each other by lowering the thickness of the micro-LED 120 matching the reinforcing structure having the greater height or by increasing the thickness of the micro-LED 120 matching the reinforcing structure having the smaller height. In other words, a thickness of at least one of the micro-LEDs 120 may be different from a thickness of at least another one of the micro-LEDs 120. On the other hand, the height of the reinforcing structure may be adjusted as well. For example, the micro-LED 120 having a smaller thickness may match the reinforcing structure having a greater height, as the micro-LED 120 having a greater thickness may match the reinforcing structure having a smaller height, to improve the evenness and the display quality.

In sum of the above, the micro-LEDs of the micro-LED display panel of the invention are configured with a plurality of reinforcing structures respectively. During the process of transferring the micro-LEDs to the substrate, the reinforcing structures can serve as buffers when the micro-LEDs being heated and pressurized. Furthermore, a Young's modulus of each reinforcing structure is smaller than a Young's modulus of the electrode layer of the corresponding micro-LED. In other words, when a bonding stress is applied to the micro-LED, the reinforcing structure has an elastic deformation greater than an elastic deformation of the micro-LED, the micro-LEDs are thus free from damages or cracks when under pressure, and reliability of the micro-LED display panel thereby enhances. On the other hand, during the process of transferring the micro-LEDs to the substrate 110, each reinforcing structure can serve as a buffer and a supporter for being contacted with the substrate or with the corresponding supporting structure on the substrate when the micro-LEDs being heated and pressurized.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A micro-LED display panel, comprising:
   a substrate;
   a plurality of micro-LEDs, disposed at a side of the substrate, wherein each of the micro-LEDs comprises an epitaxial layer and an electrode layer disposed on and electrically connected with the epitaxial layer, and the electrode layer are located between the epitaxial layers and the substrate, each of the micro-LEDs is electrically connected with the substrate through the corresponding electrode layer, wherein a ratio of a thickness of the electrode layer of each of the micro-LEDs to a thickness of the epitaxial layer of the each of the micro-LEDs is in a range of 0.3 to 0.5, and each of the electrode layers comprises a first electrode and a second electrode disposed separately; and
   a plurality of reinforcing structures, respectively disposed between the micro-LEDs and the substrate, and each of the reinforcing structures is located between the corresponding first electrode and the corresponding second electrode, wherein a Young's modulus of each of the reinforcing structures is smaller than a Young's modulus of the corresponding electrode layer.

2. The micro-LED display panel according to claim 1, wherein each of the epitaxial layers comprises a first type semiconductor layer, a light emitting layer and a second type semiconductor layer, the light emitting layer is located between the first type semiconductor layer and the second type semiconductor layer of each of the epitaxial layers, wherein each of the first electrodes is electrically contacted with the corresponding first type semiconductor layer, and each of the second electrodes is electrically contacted with the corresponding second type semiconductor layer through a conductive hole penetrating the corresponding first type semiconductor layer and the corresponding light emitting layer.

3. The micro-LED display panel according to claim 2, wherein a ratio of a depth of each of the conductive holes to a thickness of the corresponding epitaxial layer is in a range of 0.15 to 0.35.

4. The micro-LED display panel according to claim 1, wherein a length of each of the micro-LEDs is in a range of 3 nm to 100 nm, and a gap between the first electrode and the second electrode of each of the micro-LEDs is in a range of 1 nm to 30 nm.

5. The micro-LED display panel according to claim 1, wherein a ratio of a gap between each of the first electrodes and the corresponding second electrode to a length of the corresponding micro-LED is in a range of 0.1 to 0.25.

6. The micro-LED display panel according to claim 1, wherein each of the micro-LEDs has a first side surface of the first electrode and a second side surface of the second electrode, the first side surface faces toward the second side surface of each of the micro-LEDs, and each of the reinforcing structures is contacted with the corresponding first side surface and the corresponding second side surface.

7. The micro-LED display panel according to claim 1, wherein the substrate comprises a plurality of supporting structures, a plurality of first pads and a plurality of second pads, each of the first electrodes is electrically contacted with the corresponding first pad, each of the second electrodes is electrically contacted with the corresponding second pad, and each of the supporting structures is disposed between the corresponding first electrodes and the corresponding second electrodes and contacted with the corresponding reinforcing structure.

8. The micro-LED display panel according to claim 1, wherein the first electrode of each of micro-LEDs has a first bonding surface facing toward the substrate, each of the reinforcing structures has a top surface facing toward the substrate, and a step height between each of the first bonding surfaces and the corresponding top surface is smaller than or equal to 50% of a thickness of the corresponding first electrode.

9. The micro-LED display panel according to claim 8, wherein the second electrode of each of micro-LEDs has a second bonding surface facing toward the substrate, and the top surface of each of the reinforcing structures excesses the corresponding first bonding surface and the corresponding second bonding surface.

10. The micro-LED display panel according to claim 9, wherein the substrate comprises a plurality of first pads and a plurality of second pads, each of the first electrodes is electrically contacted with the corresponding first pad, each of the second electrodes is electrically contacted with the corresponding second pad, and each of the reinforcing structures inserts between the corresponding first pad and the corresponding second pad.

11. The micro-LED display panel according to claim 1, wherein at least one of the reinforcing structures has a first height, and at least another one of the reinforcing structures has a second height, wherein the first height is greater than the second height.

12. The micro-LED display panel according to claim 11, further comprising a plurality of bonding layers, wherein the micro-LEDs are electrically connected with the substrate through the bonding layers, at least one of the bonding layers has a first thickness, and at least another one of the bonding layers has a second thickness, wherein the first thickness is greater than the second thickness.

* * * * *